United States Patent [19]

Riddle et al.

[11] Patent Number: 5,814,585
[45] Date of Patent: Sep. 29, 1998

[54] BI(PB)SRCACUO SUPERCONDUCTORS

[75] Inventors: Rodney Riddle, Dorset, Great Britain; Matthias Kuntz, Seeheim-Jugenheim, Germany; Bernd Müller, Zwingenberg, Germany; Dietmar Raulin, Einhausen, Germany; Günther Feldmann-Schlobohm, Dieburg, Germany

[73] Assignee: Merck Patent Gesellschaft mit Beschrankter Haftung, Germany

[21] Appl. No.: 756,517

[22] Filed: Nov. 26, 1996

Related U.S. Application Data

[63] Continuation of Ser. No. 439,781, May 12, 1995, Pat. No. 5,614,472.

[30] Foreign Application Priority Data

May 13, 1994 [GB] United Kingdom ............... 9409660.9

[51] Int. Cl.$^6$ ............... H01L 39/12; B05D 1/08; C04B 35/505; C04B 35/45
[52] U.S. Cl. ............... 505/782; 505/425; 505/481; 505/121; 505/125; 505/126; 505/780; 505/776; 505/782; 505/510; 505/737; 505/807; 505/823; 505/501
[58] Field of Search ............... 505/425, 481, 505/121, 125, 126, 780, 776, 782, 510, 737, 807, 823, 733, 501

[56] References Cited

U.S. PATENT DOCUMENTS

| | | | |
|---|---|---|---|
| 5,047,391 | 9/1991 | Bock et al. | 505/739 X |
| 5,106,829 | 4/1992 | Quandri et al. | 505/780 X |
| 5,114,702 | 5/1992 | Pederson et al. | 505/782 X |
| 5,114,909 | 5/1992 | Shi | 505/782 X |
| 5,122,505 | 6/1992 | Gsuman et al. | 505/725 X |
| 5,140,005 | 8/1992 | Rangaswamy et al. | 505/780 X |
| 5,162,300 | 11/1992 | Bock et al. | 505/782 X |
| 5,177,055 | 1/1993 | Kinsman et al. | 505/780 X |
| 5,268,337 | 12/1993 | Katz et al. | 501/94 |
| 5,300,486 | 4/1994 | Hults et al. | 505/501 |
| 5,324,712 | 6/1994 | Su | 505/492 |
| 5,340,796 | 8/1994 | Cava et al. | 505/12 |
| 5,496,799 | 3/1996 | Yoshida et al. | 505/450 |
| 5,502,029 | 3/1996 | Doi et al. | 505/234 |
| 5,523,285 | 6/1996 | Balachandran | 505/425 |
| 5,541,154 | 7/1996 | Neubacher et al. | 505/450 |
| 5,569,641 | 10/1996 | Smith | 505/433 |
| 5,614,472 | 3/1997 | Riddle et al. | 505/425 |
| 5,646,097 | 7/1997 | Tkaczyk et al. | 505/470 |

FOREIGN PATENT DOCUMENTS

| | | |
|---|---|---|
| 371211 | 6/1990 | European Pat. Off. . |
| 1278416 | 11/1989 | Japan . |
| 90/14307 | 11/1990 | WIPO . |

OTHER PUBLICATIONS

Nishio, K., et al., "Preparation of silver–yttrium barium copper oxide composite fine powder by spray–pyrolysis", Advances in Superconductivity II, pp. 873–876, Nov. 1989.

Merkle, Brian D., et al., "Superconducting yttrium barium copper oxide particulate produced by total consumption burner processing", Mater. Sci. Eng., A124(1), 31–38, Apr. 1990.

Sparvieri, N., "Grain coupling contribution to superconductivity in ceramic YBCO (yttrium barium copper oxide) by magnetic measurements", Mater. Chem. Phys., 28(1) (1991), 133–9.

Zachariah, M.R., "Flame synthesis of high Tc superconductors", Combust. Flame, 87(1) (1991), 100–103.

Zachariah, Michael R., et al., "Aerosol processing of yttrium barium copper oxide superconductors in a flame reactor", J. Mater. Res., 6(2) (1991), 264–9.

Primary Examiner—Douglas J. McGinty
Attorney, Agent, or Firm—Millen, White, Zelano & Branigan, P.C.

[57] ABSTRACT

The invention relates to a spray pyrolytic process for the preparation of multi-element metal oxide powders useful as precursors of high temperature superconductor ceramics. Aerosols of aqueous solutions containing corresponding metal salts admixed in the required stoichiometric proportion are sprayed through an independently operated hydrogen/oxygen flame in such a way that a flame temperature of 800°–1100° C. is maintained to form said powders. Any contact of the aerosols and powders generated during the process with carbon or carbon-containing compounds or materials is strictly avoided.

14 Claims, No Drawings

BI(PB)SRCACUO SUPERCONDUCTORS

This is a continuation of the application Ser. No. 08/439,781 filed May 12, 1995, now U.S. Pat. No. 5,614,472.

The present invention concerns a process for the preparation of multi-element metal oxide powders useful as precursors of high temperature superconductor ceramics.

Although the phenomenon of superconductivity is well established, it is only in recent years that a major breakthrough was reached by the discovery of copper-containing mixed oxide ceramics which show extraordinarily high transition temperatures (high-$T_c$-superconductors). Although these mixed oxides usually consist of the oxides of at least 3 metals, they can be formed into superconducting ceramics consisting of a single homogeneous phase.

The chemical and physical requirements for precursor powders for such oxide-based superconductor ceramics are known to be particularly demanding. To allow pure phase ceramic formation, precursor powders must be uniform and homogeneous and of precise stoichiometry. Alterations in composition and stoichiometry are a specific problem when metal oxides are used which are volatile at relatively low temperatures such as lead oxide. For the formation of fully dense defect free ceramics, the precursor powders must have small, preferably less than 1 $\mu$m, spherical fully dense primary particles and a narrow agglomerated particle size distribution of preferably 1–3 $\mu$m. In the formation of superconductor ceramics with optimum properties, certain chemical impurities must be avoided. Carbon, predominantly as carbonate, is a major problem for high temperature superconductor ceramics containing the alkaline earth elements barium, calcium and strontium due to their affinity to form highly stable carbonate phases. The phase composition of ceramic precursor powders is also of the utmost importance. In many cases, this will mean powders should be of the phase required in the final ceramic. However, in many of the most demanding applications, powders must be composed of a reactive mixture of other phases which readily form the desired final phase in the following ceramic forming processes. This is particularly true for the highest performance high temperature superconductor ceramics, e.g., superconducting wires.

Thus, by using precursor powders which are composed of uniform homogeneous small spherical dense primary particles with narrow agglomerated particle size distribution and precisely controlled stoichiometry including volatile metal oxides and which contain low carbon or other chemical impurities and are composed of a phase mixture which readily forms a desired final phase in the final ceramic forming processes, high temperature superconductor ceramic with maximized properties can be expected. These powders are considered ideal precursors for the aforementioned application and any industrial mixed oxide powder preparation process must be assessed in terms of success in meeting this criteria.

The customary processes for the industrial preparation of ceramic precursor powders are methods based on mixing and grinding component metal oxides and carbonates; calcining the mixtures and grinding again, etc. It is proven that these processes are not able to give the optimum powder characteristics as described above.

In international patent application WO 89/02871, a process for the preparation of multi-element metal oxide powders for use as high temperature superconductor ceramic precursors is described which is based on the evaporative decomposition of solution (EDS) technique. The process is based upon spraying mixed metal salt solutions through a tube-like furnace heated to a temperature of 800°–1100° C. Although this process yields oxide powders with acceptable properties regarding particle size, chemical homogeneity, purity, and phase formation, the particles obtained are not fully dense but hollow spheres. Also, the powders as collected contain several percent of moisture. Furthermore, the external electric heating of the furnace only allows low energy efficiencies and a limited scope for scale-up to quantities required for industrial productions.

In international patent application WO 90/14307, a spray pyrolytic process for the manufacture of mixed metal oxide powders for the use as high-performance ceramics precursors is described. This process is based on spraying mixed metal nitrate solutions together with organic compounds and/or hydrocarbon gas, each serving as a fuel, into a reactor whereby a self-supporting combustion between the fuel and nitrate oxygen of the solution takes place. Due to its high-energy efficiency, this process can easily be scaled up to satisfy industrial demands. This process yields fine powders of small fully dense and homogeneous particles. Due to the extremely high temperatures of at least 2000° C. which are generated during this combustion process in the droplet/particle, powders containing volatile metal oxides such as lead oxide cannot be prepared with a sufficient degree of compositional control. Furthermore, the ceramic powders are obtained in their respective high temperature phases which is a specific drawback when the process is applied to produce high temperature superconductor precursor powders. Finally, the reactions between carbon-containing organic compounds and nitrates during the combustion process will generate large quantities of carbon dioxide which will result in several percent of carbon as carbonate in products containing the oxides of barium, calcium and strontium.

European Patent 0 371 211 B1 relates to a spray pyrolytic process for the manufacture of fine homogeneous ceramic powders in which a solution or suspension of substances containing the constituents of the ceramic powder is sprayed by the aid of a combustible gas, preferably hydrogen gas, into a reactor where the gas is burned. The conversion of the sprayed droplets to the oxide powders is said to take place in the flame at measurable temperatures of 1200°–1300° C. In case nitrate solutions are used, it is believed that much higher temperatures act on the system droplet/particle similar to the process discussed before. This is confirmed by the fact that spinel phase oxides ($MgAl_2O_4$) which clearly are high temperature phase materials are obtainable by this process. Thus, it can be expected that this process would produce high temperature superconductor powders in the phase(s) formed at high temperatures, and powders containing volatile metal oxides, such as lead oxide, cannot be prepared with a sufficient degree of compositional control.

Summing up the prior art, existing spray pyrolytic processes cannot be considered ideal for the manufacture of high temperature superconductor precursor powders because of either their disadvantages of generating undesired high temperature phases, being unsuited to secure a correct composition with respect to volatile oxides, and to avoid carbonate contamination, or due to disadvantageous particle morphology and limitations in satisfactory scale-up to meet industrial demands.

It was therefore the object of the present invention to provide a process for the preparation of multi-element metal oxide powders useful as precursors of high temperature superconductor ceramics by which the disadvantages of the prior art processes could be overcome.

It has been found that this objective can be met by a process in which aerosols of aqueous solutions containing corresponding metal salts admixed in the required stoichiometric proportion are burned in a hydrogen/oxygen flame, characterized in that the aerosol is sprayed through an independently operated hydrogen/oxygen flame in such a way that a flame temperature of 800° to 1100° C. is maintained and that any contact of the aerosols and the powders generated through the process with carbon or carbon-containing compounds or materials is strictly avoided.

Surprisingly, it has been found that, when mixed salt solution aerosols are sprayed into an independently operated hydrogen fuelled flame, a flame temperature and an overall reactor temperature of 800°–1100° C. can easily be maintained by conventional control of the flame characteristics, of the solution parameters, the aerosol formation and spraying characteristics as known by the skilled worker. Thus, by careful optimization of the parameters for aerosol generation, the position of the aerosol source relative to the burner and the flame geometry, and by ensuring that the aerosol enters directly from the rear of the flame front at the appropriate velocity, the thermal contact and residence time of the solution droplets in the flame can be controlled to ensure that only water evaporation, salt decomposition and low temperature mixed oxide phase formation is given and high temperature phase formation and evaporation of volatile metal oxides such as lead oxide does not take place.

By this new process, spherical fully dense and extremely small primary particles are formed which are optimum for ceramics processing. When using conventional sprayheads producing, e.g., 10 $\mu$m solution droplets, 100–500 nm primary particles are formed. This volume reduction is beyond the levels calculated for shrinkage by water evaporation and thermal decomposition of the crystallites of metal salt solute alone, which would produce significantly larger particles containing voids. The particle size and density is consistent with high temperature spray pyrolytic processes as described before, despite the fact that the temperature within the droplet does not exceed that in the reactor and the process operates with low temperatures not exceeding 1100° C. in the flame. The unexpected formation of such small fully dense spherical primary particles must result from the rapid explosion of each solution droplet when it enters the intense energy field within the narrow hydrogen/oxygen flame. Hence, high temperature phases in the products are not achieved and the process allows production of powders containing controlled amounts of volatile metal oxides such as lead oxide.

Furthermore, it is surprisingly found that, if sufficient care is taken in the design, construction and operation of the reactor and process, low carbon, typically less than 0.1%, containing powders for compositions containing metal oxides such as barium, strontium and calcium can be produced. Thus, by precluding hydrocarbon fuels, carbon-containing compounds, such as acetates, citrates, etc., ensuring all gases are free of carbon dioxide, including air supplied as aerosol propellant and burner oxidant, and ensuring the system is constructed of suitable carbon-free materials, to be gas-tight avoiding contact to the natural atmosphere, low carbon powders can be formed. Thus, the process does not allow the formation of carbon dioxide, avoiding contact and reaction of such oxides with this gas and preventing the formation of deleterious carbon-containing phases.

This is particularly advantageous in consideration that this process applies to the production of the reactive oxides of barium, strontium and calcium in extremely fine particles with large surface areas and hence extremely high surface activity.

It is clear that this production process, with suitable optimization, can be readily seen to be useful for the preparation of oxide mixtures requiring any composition or combination of an extremely broad range of metals, preferably bismuth, lead, copper, rare earth elements and alkaline earth elements, but also various others, including for example chromium, titanium, zirconium, lanthanum, sodium, lithium, potassium, silver, zinc, aluminum, nickel, manganese, etc. This can be achieved simply by employing respective metal salt solutions of appropriate composition and concentration. Specifically preferred as the salts are the corresponding nitrates. To prove the general applicability of this new process, it has been demonstrated in the preparation of precursor powders for a highly demanding electroceramics field, viz., high temperature superconductors. The merits of this new process have been confirmed by the production of precursor materials and ceramics of the precisely controlled quality and composition required for this technically exacting applications field.

The process has been operated using solutions containing mixtures of bismuth, strontium, calcium and copper nitrates to give powders with compositions of general formula $Bi_xSr_xCa_yCu_xO_z$, where x=1.0–3.0, y=0.5–2.5 and z is not specified. The process has also been operated using solutions containing lead, bismuth, strontium, calcium and copper nitrates to give powders with compositions of general formula $Pb/Bi_xSr_xCa_xCu_yO_z$, were x=1.5–3.0, y=2.5–3.5 and z is not specified. Powders with spherical dense primary particles 100–500 nm and agglomerate size distribution 1–3 $\mu$m composed of the required metal composition and low temperature binary and ternary phases, with <0.1% moisture and <0.1% carbon have been produced in 0.5–5 kg quantities.

It has been shown that the powders are highly sinteractive and can be readily converted to a preferred phase mixture by annealing in air for 1–10 hours at 700°–800° C. Thereafter, the powders can be immediately compressed, without further mixing or milling, to a compact which is then fired at a temperature of about 850° C. to produce a dense ceramic body of the desired high temperature superconducting phase.

A small scale system has been constructed and used to demonstrate this process in the preparation of powders at the rate of 0.1–1.0 kg/hr, but a skilled worker could use this as a basis for the design and construction of a very compact and efficient plant for increased scale industrial production. In the system, a hydrogen flame is burnt with oxygen or air with carbon dioxide removed using calcium oxide, CarbosorbAS® or another filter material. The flame is created using a ring burner or multi-head burner(s) to produce a flame front of controllable depth and energy intensity. The flame is formed in a tubular reactor (20 cm diameter, 1000 cm long) constructed of stainless steel, inconel, hastalloy, quartz, zirconia or zirconia-coated alloys placed in a vertical or horizontal manner. A mixed metal nitrate solution containing 5–50% oxide equivalent is supplied at a rate of 0.5–5.0 kg/hr to a conventional stainless steel, inconel or hastalloy sprayhead. Nitrogen, oxygen or air with carbon dioxide removed, supplied at 0.2–2.0 bar, is used as the aerosol generator propellant gas. The sprayhead is located at a point in the center of the ring burner or multi-head burners. The aerosol generated is directed into the base of the narrow flame front and the reactor is operated at overall temperatures in the range 800°–1100° C. Powders generated are led into a collection system operating at temperatures in the range 250°–750° C. This is particularly beneficial regarding powder quality by minimizing residual moisture and nitrate content. The powders may be collected with a cyclone or with filters such as porous sintered inconel, stainless steel, mineral fiber or ceramic media. When using filter media, the housing must be inconel, stainless steel, hastalloy or other high temperature resistant materials. The system parts must be connected with extreme care and using gas-tight seals to avoid any ingress of atmospheric, carbon dioxide-containing air into the system.

By use of a commercial lambda probe in the reactor, the reduction/oxidation quotient (system redox) can be monitored. This can be used as a measure to allow controlled modification of various process parameters and hence control the system. In normal operation, aqueous solutions containing metal nitrates only are used and the total system oxidant/fuel ratio is adjusted to ensure that the reactor atmosphere is in an oxidizing condition overall. In another variation, the system oxidant/fuel ratio may be adjusted to allow the reactor atmosphere to be in a reducing condition overall, in another variation, nitrogen-based compounds serving as reducing or oxidizing agents including nitric acid, ammonia, ammonium nitrate, hydrazine and hydroxylamine in quantities optimized according to the final product and metal nitrate solution concentration, can be introduced into the reactor either by addition to the metal nitrate solution or as an aqueous solution sprayed separately into the reactor to further adjust the system redox and/or promote other energy-releasing chemical reactions. A further variation of the process is given when the system oxidants/fuel ratio is adjusted to allow the hydrogen combustion to be sustained with oxygen provided by the solution(s) of metal nitrates and/or other additives. In this variation, the oxygen feed to the hydrogen-oxygen flame, after starting the process, is reduced in such a manner that a substantially self-sustaining combustion takes place between the hydrogen and the nitrate oxygen of the solution.

The high quality of the powders prepared according to the process as described lead to ceramics having improved performance and thus being preferred for use in highly demanding ceramics forming processes in high temperature superconductor technology such as powder-in-tube production of high temperature superconducting wires.

Without further elaboration, it is believed that one skilled in the art can, using the preceding description, utilize the present invention to its fullest extent. The following preferred specific embodiments are, therefore, to be construed as merely illustrative, and not limitative of the remainder of the disclosure in any way whatsoever.

In the foregoing and in the following examples, all temperatures are set forth uncorrected in degrees Celsius and unless otherwise indicated, all parts and percentages are by weight.

The entire disclosure of all applications, patents and publications, cited above and below, and of corresponding British application 9409660.9, filed May 13, 1994, are hereby incorporated by reference.

EXAMPLES

Example 1

Preparation of a $Bi_{2.0}Sr_{2.0}Ca_{1.0}Cu_{2.0}O_x$ powder

A 12.60 kg aqueous solution containing 1.563 kg $Bi(NO_3)_3.5H_2O$, 0.682 kg $Sr(NO_3)_2$, 0.381 kg $Ca(NO_3)_2.4H_2O$ and 0.779 kg $Cu(NO_3)_2.3H_2O$ was prepared. Spray was generated by a Spraying Systems ¼J sprayhead with a compressed air supply pressure of 0.5–1.0 bar. The compressed air feed had been previously passed through a calcium oxide column to remove carbon dioxide in the air. The sprayhead was sited at the top of an inconel reactor tube 100 cm long and 20 cm in diameter centrally located in the middle of a ring burner. Hydrogen and air, filtered carbon dioxide free, were supplied to the burner in a volume ratio of 12.4–2.6 and the burner ignited. Under these conditions, the overall reactor temperature was 950°–1000° C. and the overall reactor lambda value was 10–30 (oxidizing). The hot product gases were led from the reactor into an inconel housing holding ceramic mineral fiber filter media maintained at 400°–450° C. Approximately 1250 g of product was collected over the 3-hour period. ICPES analysis (inductively coupled plasma atomic emission spectroscopy) confirmed the powder stoichiometry as $Bi_{2.0}Sr_{2.0}Ca_{1.0}Cu_{2.0}O_x$, particle size analysis indicated a narrow particle size distribution with $D_{50}$ 0.98 μm and $D_{90}$ 1.47 μm. The primary particle size was <1 μm by SEM analysis. Powder X-ray diffraction analysis proved that the powder was composed of a mixture of copper oxide, copper strontium oxide, calcium oxide and copper strontium bismuth oxide phases. Wet chemical analysis found <0.1% carbon and <0.1% water.

Example 2

Preparation of $Pb/Bi_{2.1}Sr_{1.9}Ca_{2.0}Cu_{3.0}O_x$ powder

A 12.00 g aqueous solution of 0.113 g $Pb(NO_3)_2$, 0.893 kg $Bi(NO_3)_3.5H_2O$, 0.404 kg $Sr(NO_3)_2$, 0.479 kg $Ca(NO_3)_2.4H_2O$ and 0.739 kg $Cu(NO_3)_2.H_2O$ was prepared. Spray was generated using a Spraying Systems ¼J sprayhead with a compressed air supply pressure of 0.5–1.0 bar. The compressed air feed had been previously passed through a calcium oxide column to remove carbon dioxide in the air. The sprayhead was sited at the top of an inconel reactor tube 100 cm long and 20 cm in diameter centrally located in the middle of a ring burner. Hydrogen and air, filtered carbon dioxide free, were supplied to the burner in a volume ratio of 1:2.0–2.2 and the burner ignited. Under these conditions, the overall reactor temperature was 850°–900° C. and the overall reactor lambda value was 20–40 (oxidizing). The hot product gases were led from the reactor into an inconel housing holding ceramic mineral fiber filter media maintained at 400°–450° C. Approximately 750 g of product was collected over the 4-hour period. ICPES analysis confirmed that the powder contained $Pb/Bi_{2.1}Sr_{1.9}Ca_{2.0}Cu_{3.0}O_x$ stoichiometry. Particle size analysis indicated that the powder had narrow size distribution with $D_{50}$ 1.08 μm, $D_{90}$ 2.33 μm and primary particle size was <1 μm by SEM analysis. Powder X-ray diffraction analysis proved that the powder was a mixture of calcium lead oxide and copper strontium bismuth oxide phases. Wet chemical analysis found <0.1% carbon and <0.1% water.

Example 3

Preparation of $Bi_{2.0}Sr_{2.0}Ca_{1.0}Cu_{2.0}O_x$ powder

A 4.93 kg aqueous solution containing 1.155 kg $Bi(NO_3)_3.5H_2O$, 0.504 kg $Sr(NO_3)_2$, 0.281 kg $Ca(NO_3)_2.4H_2O$, 0.575 kg $Cu(NO_3)_2.3H_2O$ and 0.822 kg $NH_4NO_3$ was prepared. Spray was generated by a Spraying Systems ¼J sprayhead with a compressed air supply pressure of 1.5–2.0 bar. The compressed air feed had been previously passed through a calcium oxide column to remove carbon dioxide in the air. The sprayhead was sited at the top of an inconel reactor tube 100 cm long and 20 cm in diameter centrally located in the middle of a ring burner. Hydrogen and air, filtered carbon dioxide free, were supplied to the burner in a volume ratio of 1:2.2–2.4 and the burner ignited. Under these conditions, the overall reactor temperature was 850°–900° C. and the overall reactor lambda value was 20–40 (oxidizing). The hot product gases were led from the reactor into an inconel housing holding ceramic mineral fiber filter media maintained at 350°–400° C. Approximately 850 g of product was collected over the 2-hour period. ICPES analysis confirmed that the powder contained $Bi_{2.0}Sr_{2.0}Ca_{1.0}Cu_{2.0}O_x$ stoichiometry. Particle size analysis indicated that the powder had narrow size distribution with $D_{50}$ 1.16 μm, $D_{90}$ 2.49 μm and primary particle size was <1 μm by SEM analysis. Powder X-ray diffraction analysis proved that the powder was a mixture of copper oxide, copper strontium oxide, copper calcium oxide and copper strontium bismuth oxide phases. Wet chemical analysis found <0.1% carbon and <0.1% water.

Example 4

Preparation of $Pb/Bi_{2.1}Sr_{1.9}Ca_{2.0}Cu_{3.0}O_x$ powder

A 10.6 kg aqueous solution of 0.135 kg $Pb(NO_3)_2$, 1.070 g $Bi(NO_3)_3.5H_2O$, 0.484 kg $Sr(NO_3)_2$, 0.575 kg $Ca(NO_3)_2.4H_2O$ and 0.886 kg $Cu(NO_3)_2.3H_2O$ was prepared. Spray was generated using a Spraying Systems ¼J sprayhead with a compressed air supply pressure of 1.5–2.0 bar. The compressed air feed had been previously passed through a calcium oxide column to remove carbon dioxide in the air. The sprayhead was sited at the top of an inconel reactor tube 100 cm long and 20 cm in diameter centrally located in the middle of a ring burner. Hydrogen and air, filtered carbon dioxide free, were supplied to the burner in a volume ratio of 1:1.6–1.8 and the burner ignited. Under these conditions, the overall reactor temperature was 900°–950° C. and the overall reactor lambda value was 740–780 (reducing). The hot product gases were led from the reactor into an inconel housing holding ceramic mineral fiber filter media maintained at 400°–450° C. Approximately 720 g of product was collected over the 2-hour period. ICPES analysis confirmed that the powder contained $Pb/Bi_{2.1}Sr_{1.9}Ca_{2.0}Cu_{3.0}O_x$ stoichiometry. Particle size analysis indicated that the powder had narrow size distribution with $D_{50}$ 1.03 μm, $D_{90}$ 2.23 μm and primary particle size was <1 μm by SEM analysis. Powder X-ray diffraction analysis proved that the powder phase composition was a mixture of calcium lead oxide and copper strontium bismuth oxide phases. Wet chemical analysis found <0.1% carbon and <0.1% water.

Example 5

Preparation of $Pb/Bi_{2.1}Sr_{1.9}Ca_{2.0}Cu_{3.0}O_x$ superconductor $Pb/Bi_{2.1}Sr_{1.9}Ca_{2.0}Cu_{3.0}O_x$ powder as prepared in Example 4 was first calcined in air at 800° C. for 8 hours to produce a phase mixture of $Bi_{2.0}Sr_{2.0}Ca_{1.0}Cu_{2.0}O_x$ and $CaPbO_3$. It was then compressed to a "green body" at room temperature using diethyl ether as binder. The compact was fired at 850° C. for 10 hours to produce a dense ceramic body which analyzed as pure superconducting phase $Pb/Bi_{2.1}Sr_{1.9}Ca_{2.0}Cu_{3.0}O_x$ by the X-ray diffraction method.

The preceding examples can be repeated with similar success by substituting the generically or specifically described reactants and/or operating conditions of this invention for those used in the preceding examples.

From the foregoing description, one skilled in the art can easily ascertain the essential characteristics of this invention, and without departing from the spirit and scope thereof, can make various changes and modifications of the invention to adapt it to various usages and conditions.

What is claimed is:

1. A high temperature superconductor ceramic formed from multi-element metal oxide powders having the formula $Bi_xSr_xCa_yCu_xO_z$, where x=1.0–3.0, y=0.5–2.5 and z is not specified or the formula $Pb/Bi_xSr_xCa_xCu_yO_z$, where x=1.5–3.0, y=2.5–3.5 and z is not specified, prepared by a spray-pyrolytic process comprising the steps of mixing salts of the metals needed to form said powders in an aqueous solution; forming an aerosol of said aqueous solution; spraying said aerosol through an independently operated hydrogen/oxygen flame having a temperature of 800° C. to 1100° C.; and collecting said powders which form after said spraying; wherein said aerosol and said powder do not contact elemental carbon, carbon containing compounds or materials containing carbon.

2. A high temperature superconductor ceramic as in claim 1, wherein the spray-pyrolytic process for preparing the multi-element metal oxide powders is characterized in that the aerosol is sprayed through the flame by means of a sprayhead which is located in the center of a hydrogen/oxygen operated multi-head or ring burner.

3. A high temperature superconductor ceramic as in claim 1, wherein the spray-pyrolyfic process for preparing the multi-element metal oxide powders is characterized in that all gases used are freed of carbon dioxide.

4. A high temperature superconductor ceramic as in claim 1, wherein the spray-pyrolytic process for preparing the multi-element metal oxide powders is characterized in that the reaction equipment is made of carbon-free materials.

5. A high temperature superconductor ceramic as in claim 1, wherein the spray-pyrolytic process for preparing the multi-element metal oxide powders is characterized in that the aerosol spray propellant gas, if required, is oxygen, nitrogen or air.

6. A high temperature superconductor ceramic as in claim 1, wherein the spray-pyrolytic process for preparing the multi-element metal oxide powders is characterized in that a solution is used comprising the salts of rare earth elements and/or alkaline earth elements and copper.

7. A high temperature superconductor ceramic as in claim 6, wherein the spray-pyrolytic process for preparing the multi-element metal oxide powders is characterized in that the solution further contains the salts of lead and/or bismuth.

8. A high temperature superconductor ceramic as in claim 6, wherein the spray-pyrolytic process for preparing the multi-element metal oxide powders is characterized in that the solution contains as the salts nitrates of rare earth elements and/or alkaline earth elements and copper.

9. A high temperature superconductor ceramic as in claim 1, wherein the spray-pyrolytic process for preparing the multi-element metal oxide powders is characterized in that after starting the process, the oxygen feed to the hydrogen/oxygen flame is reduced in such a manner that a substantially self-sustaining combustion takes place between the hydrogen and the nitrate oxygen of the solution.

10. A high temperature superconductor ceramic as in claim 1, wherein the spray-pyrolytic process for preparing the multi-element metal oxide powders is characterized in that nitrogen-based reducing agents and/or nitrogen-based oxidizing agents are introduced into the metal salt solution or independently sprayed into the reactor as an aqueous solution so as to control the overall reduction/oxidation quotient of the system.

11. A high temperature superconductor ceramic of claim 1, wherein the metal oxide produced contains less than 0.1% carbon.

12. A high temperature superconductor ceramic as defined in claim 1 derived from YBuCuO, BiSrCaCuO or PbBiSrCaCuO multi-element metal oxide powder.

13. A high temperature superconductor ceramic of claim 1, wherein the spray-pyrolytic process for preparing multi-element metal oxide powders is characterized in that the metal salts contain oxygen and the oxygen feed to the hydrogen/oxygen flame is reduced after starting the process in such a manner that a substantially self-sustaining combustion takes place between the hydrogen/oxygen and metal salt.

14. A high temperature superconductor ceramic as in claim 1, wherein the multi-element metal oxide powders is selected from the group consisting of $Bi_{2.0}Sr_{2.0}Ca_{1.0}Cu_{2.0}O_x$, $Pb/Bi_{2.1}Sr_{1.9}Ca_{2.0}Cu_{3.0}O_x$, $Bi_{2.0}Sr_{2.0}Ca_{1.0}Cu_{2.0}O_x$ and $Pb/Bi_{2.1}Sr_{1.9}Ca_{2.0}Cu_{3.0}O_x$.

\* \* \* \* \*